(12) United States Patent
Hsieh et al.

(10) Patent No.: US 8,556,154 B2
(45) Date of Patent: Oct. 15, 2013

(54) CLAMPING TOOL AND EQUIPMENT FOR REWORK PROCESS

(71) Applicant: Wistron Corporation, New Taipei (TW)

(72) Inventors: Hao-Chun Hsieh, New Taipei (TW); Chia-Hsien Lee, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 0 days.

(21) Appl. No.: 13/771,099

(22) Filed: Feb. 20, 2013

(65) Prior Publication Data

US 2013/0240608 A1    Sep. 19, 2013

(30) Foreign Application Priority Data

Mar. 19, 2012 (TW) .............. 101109316 A

(51) Int. Cl.
*B23K 37/04* (2006.01)
*B23K 1/018* (2006.01)

(52) U.S. Cl.
USPC ............ 228/13; 228/49.5; 228/119; 228/191; 228/264

(58) Field of Classification Search
None
See application file for complete search history.

(56) References Cited

U.S. PATENT DOCUMENTS

| | | | | |
|---|---|---|---|---|
| 3,529,760 A * | 9/1970 | Hickman et al. | ........ | 228/51 |
| 3,632,973 A * | 1/1972 | O'Keefe | ........ | 219/230 |
| 3,649,809 A * | 3/1972 | Halstead | ........ | 219/228 |
| 3,842,478 A * | 10/1974 | Schreckeneder | ........ | 228/20.5 |
| 4,518,110 A * | 5/1985 | Breske et al. | ........ | 228/20.5 |
| 4,696,096 A * | 9/1987 | Green et al. | ........ | 29/829 |
| 4,761,887 A * | 8/1988 | Brown et al. | ........ | 33/702 |
| 4,894,910 A * | 1/1990 | Reimer et al. | ........ | 29/764 |
| 4,956,911 A * | 9/1990 | Zaremba et al. | ........ | 29/721 |
| 4,962,878 A * | 10/1990 | Kent | ........ | 228/49.5 |
| 5,054,681 A * | 10/1991 | Kim | ........ | 228/191 |
| 5,072,874 A * | 12/1991 | Bertram et al. | ........ | 228/264 |
| 5,145,101 A * | 9/1992 | Brown et al. | ........ | 228/51 |
| 5,147,081 A * | 9/1992 | Kim | ........ | 228/51 |
| 5,278,393 A * | 1/1994 | Kim | ........ | 219/228 |
| 5,425,491 A * | 6/1995 | Tanaka et al. | ........ | 228/44.7 |
| 5,549,240 A * | 8/1996 | Urban | ........ | 228/264 |
| 5,560,531 A * | 10/1996 | Ruszowski | ........ | 228/19 |
| 5,785,237 A * | 7/1998 | Lasto et al. | ........ | 228/180.22 |
| 5,890,646 A * | 4/1999 | Tang et al. | ........ | 228/180.21 |
| 5,934,542 A * | 8/1999 | Nakamura et al. | ........ | 228/44.7 |
| 5,961,026 A * | 10/1999 | Olson et al. | ........ | 228/13 |
| 6,453,537 B1 * | 9/2002 | Heim et al. | ........ | 29/426.4 |
| 6,550,669 B1 * | 4/2003 | Walz et al. | ........ | 228/264 |
| 2002/0033409 A1 * | 3/2002 | Cilia et al. | ........ | 228/19 |
| 2006/0196912 A1 * | 9/2006 | Sato | ........ | 228/10 |
| 2009/0321500 A1 * | 12/2009 | Okada et al. | ........ | 228/119 |

FOREIGN PATENT DOCUMENTS

| | | | |
|---|---|---|---|
| GB | 2149706 A | * | 6/1985 |
| JP | 06-021281 A | * | 1/1994 |
| JP | 06-244590 A | * | 9/1994 |

\* cited by examiner

*Primary Examiner* — Kiley Stoner
(74) *Attorney, Agent, or Firm* — Winston Hsu; Scott Margo

(57) ABSTRACT

A clamping tool for rework process includes a casing, two clamping members and a thermal expansion member. The casing has a base. The two clamping members are pivotally connected to the casing and located at opposite sides of the base. The thermal expansion member is disposed in the casing and located over the base. The thermal expansion member is capable of expanding by heat so as to push the two clamping members to rotate with respect to each other.

13 Claims, 6 Drawing Sheets

CLAMPING TOOL AND EQUIPMENT FOR REWORK PROCESS

BACKGROUND OF THE INVENTION

1. Field of the Invention

The invention relates to a clamping tool and an equipment and, more particularly, to a clamping tool and an equipment for rework process.

2. Description of the Prior Art

System in package (SiP) is a new package technology, which not only can assemble a plurality of chips in one package but also can stack chips and different types of elements (e.g. passive component, capacitor, resistor, connector, antenna, etc.) so as to configure a complicated and integrated system. SiP comprises lots of technologies including multi-chip module (MCM), multi-chip package (MCP), stack die, package on package (PoP), package in package (PiP) and embedded substrate. For exterior structure, MCM is 2D package and MCP, stack die, PoP and PiP are 3D package. Since 3D package conforms to some requirements of miniature, high efficiency and so on, the industry pays much attention to it recently.

In general, PoP can be achieved by using ball grid array (BGA) package technology. BGA package utilizes solder balls on the bottom of a substrate to connect a circuit board and replaces conventional metal conducting wires with the solder balls. When a BGA component on a circuit board has to be replaced or repaired, the BGA component has to be removed from the circuit board by rework process and then a new BGA component can be soldered onto the circuit board.

When a PoP component is reworked, the solder balls of an upper component of the PoP component may be melted first since hot wind is blown from the top such that only the upper component can be removed. If the number of solder balls of the upper component is different from the number of solder balls of a lower component, it become difficult to control whether the solder balls of the upper component of the PoP component or the solder balls of the lower component of the PoP component will be melted first. Thus the operator does not know which component will be removed. Moreover, present tool for removing PoP component has to be customized and different PoP components need different tools correspondingly so that the cost will increase accordingly.

SUMMARY OF THE INVENTION

The invention provides a clamping tool and an equipment for rework process so as to solve the aforesaid problems.

According to an embodiment of the invention, a clamping tool for rework process comprises a casing, two clamping members and a thermal expansion member. The casing has a base. The two clamping members are pivotally connected to the casing and located at opposite sides of the base. The thermal expansion member is disposed in the casing and located over the base. The thermal expansion member is capable of expanding by heat so as to push the two clamping members to rotate with respect to each other.

According to another embodiment of the invention, an equipment for rework process comprises a hot wind chamber, a moving mechanism and a clamping tool. The moving mechanism is movably disposed in the hot wind chamber. The clamping tool is disposed in the hot wind chamber. The clamping tool comprises a casing, two clamping members and a thermal expansion member. The casing has a base. The moving mechanism is connected to the casing and used for driving the casing to move with respect to the hot wind chamber. The two clamping members are pivotally connected to the casing and located at opposite sides of the base. The thermal expansion member is disposed in the casing and located over the base. The thermal expansion member is capable of expanding by heat so as to push the two clamping members to rotate with respect to each other.

As mentioned in the above, when the clamping tool of the invention is used in rework process, the moving mechanism can drive the clamping tool to move to a specific position above a component, which needs to be reworked. Afterward, when a hot wind is blown out of the hot wind chamber to heat the component, the thermal expansion member is also heated by the hot wind and then expands so as to push the two clamping members to rotate with respect to each other. Consequently, the two clamping members will clamp the component. After the solder balls are melted, the moving mechanism can move the clamping tool so as to remove the component. Therefore, when the clamping tool of the invention is used to rework a multilayer PoP component, the operator can select to remove which component by changing a distance between the clamping tool and the PoP component such that the clamping tool of the invention can be adapted to any PoP components and need not be customized.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
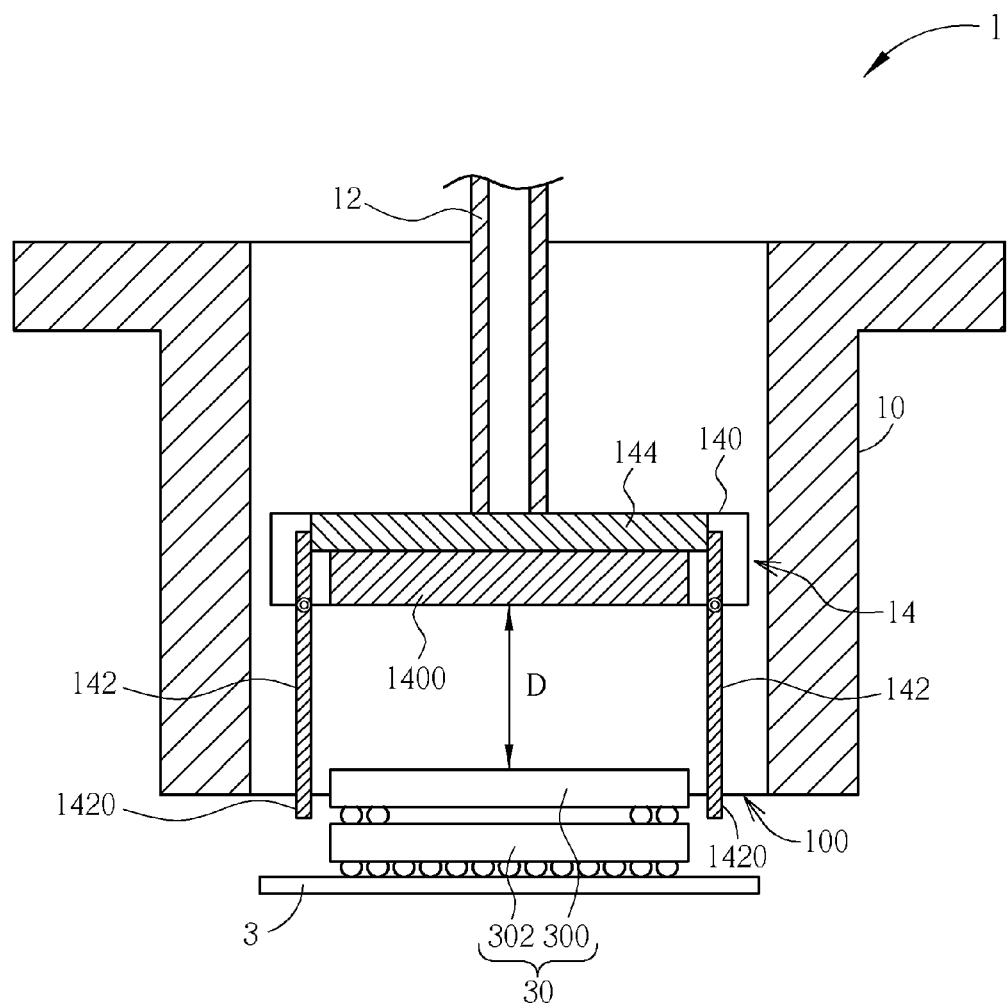
FIG. 1 is a schematic diagram illustrating a cross-section of an equipment for rework process and a circuit board according to an embodiment of the invention.
Figure 2:
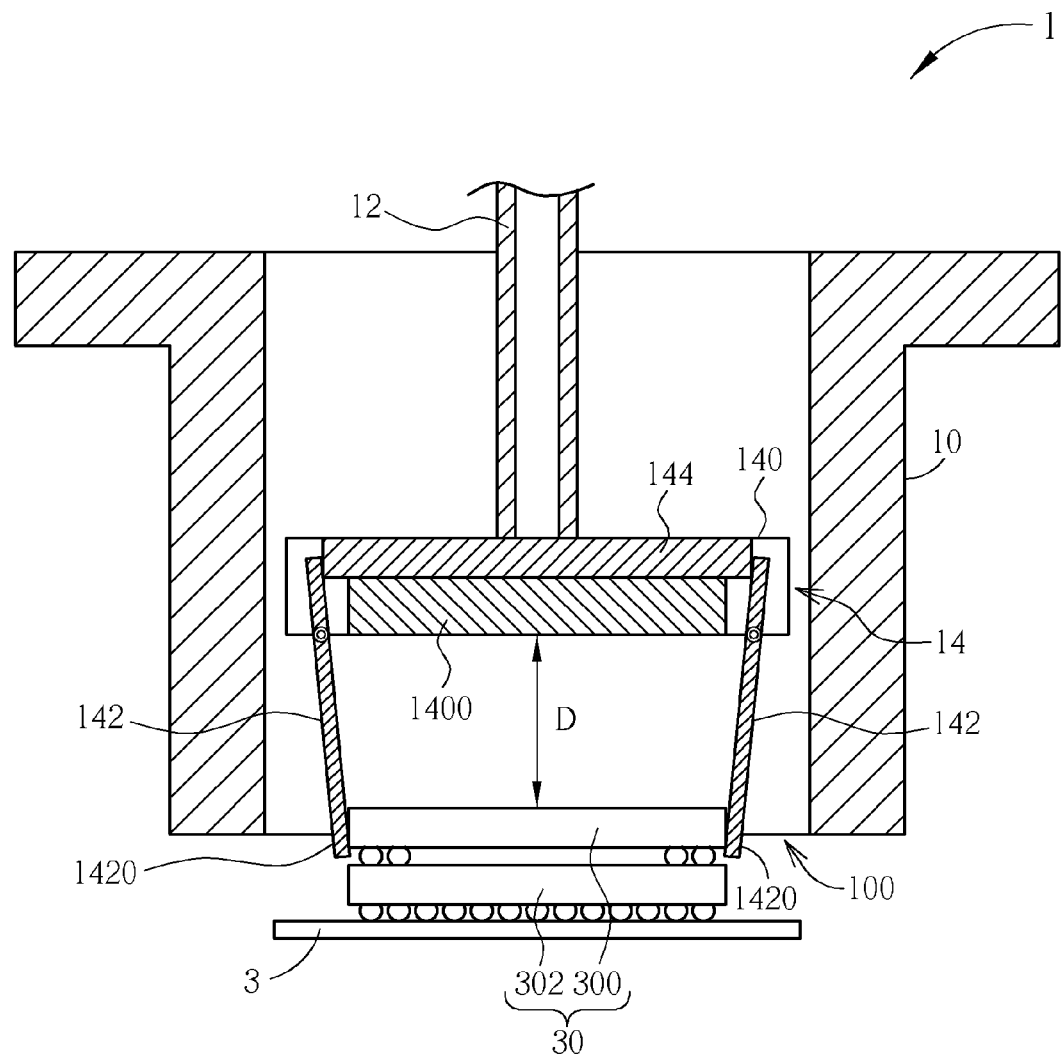
FIG. 2 is a schematic diagram illustrating the thermal expansion member shown in FIG. 1 expanding by heat.

Referring to FIGS. 1 and 2, FIG. 1 is a schematic diagram illustrating a cross-section of an equipment 1 for rework process and a circuit board 3 according to an embodiment of the invention, and FIG. 2 is a schematic diagram illustrating the thermal expansion member 144 shown in FIG. 1 expanding by heat. As shown in FIGS. 1 and 2, the equipment 1 for rework process comprises a hot wind chamber 10, a moving mechanism 12 and a clamping tool 14. The moving mechanism 12 is movably disposed in the hot wind chamber 10. The clamping tool 14 is disposed in the hot wind chamber 10. The clamping tool 14 comprises a casing 140, two clamping members 142 and a thermal expansion member 144. The casing has a base 1400. The moving mechanism 12 is connected to the casing 140 and used for driving the casing 140 to move with respect to the hot wind chamber 10. In this embodiment, the moving mechanism 12 may be, but not limited to, a vacuum nozzle for drawing the casing 140. The two clamping members 142 are pivotally connected to the casing 140 and located at opposite sides of the base 1400. The thermal expansion member 144 is disposed in the casing 140 and located over the base 1400. The thermal expansion member 144 is capable of expanding by heat so as to push the two clamping members 142 to rotate with respect to each other. The thermal expansion member 144 may be made of plastic or rubber. For example, the thermal expansion member 144 maybe made of polyimide (PI) or the like with high thermal expansion coefficient. Furthermore, the heat tolerance of the thermal expansion member 144 may exceed 350° C. The casing 140 and the two clamping members 142 may be made of, but not limited to, stainless steel.

As shown in FIGS. 1 and 2, the equipment 1 is installed above a circuit board 3 and there is a component 30, which needs to be reworked, on the circuit board 3, wherein the component 30 comprises an upper component 300 and a lower component 302 stacked by BGA package technology. When the equipment 1 is used to rework the component 30 on the circuit board 3, the hot wind chamber 10 is located above the circuit board 3 and a hot wind outlet 100 of the hot wind chamber 10 faces the component 30 such that a hot wind can be blown out of the hot wind outlet 100 toward the component 30, so as to heat the component 30. It should be noted that the component 30, which needs to be reworked, on the circuit board 3 is not limited to two layers.

In this embodiment, the moving mechanism 12 can drive the clamping tool 14 to move with respect to the hot wind chamber 10 up and down so as to change a distance D between the casing 140 and the component 30 and select to remove which component. As shown in FIG. 1, if the upper component 300 needs to be removed, the moving mechanism 12 can be operated to drive the clamping tool 14 to move with respect to the hot wind chamber 10 so as to move two clamping ends 1420 of the two clamping members 142 to opposite sides of the upper component 300, respectively. When the hot wind is blown out of the hot wind chamber 10 to heat the component 30, the thermal expansion member 144 is also heated by the hot wind and then expands so as to push the two clamping members 142 to rotate with respect to each other. Consequently, the two clamping ends 1420 of the two clamping members 142 will clamp the upper component 300. After the solder balls between the upper component 300 and the lower component 302 are melted, the moving mechanism 12 can be operated to drive the clamping tool 14 to move upwardly so as to remove the upper component 300.

Figure 3:
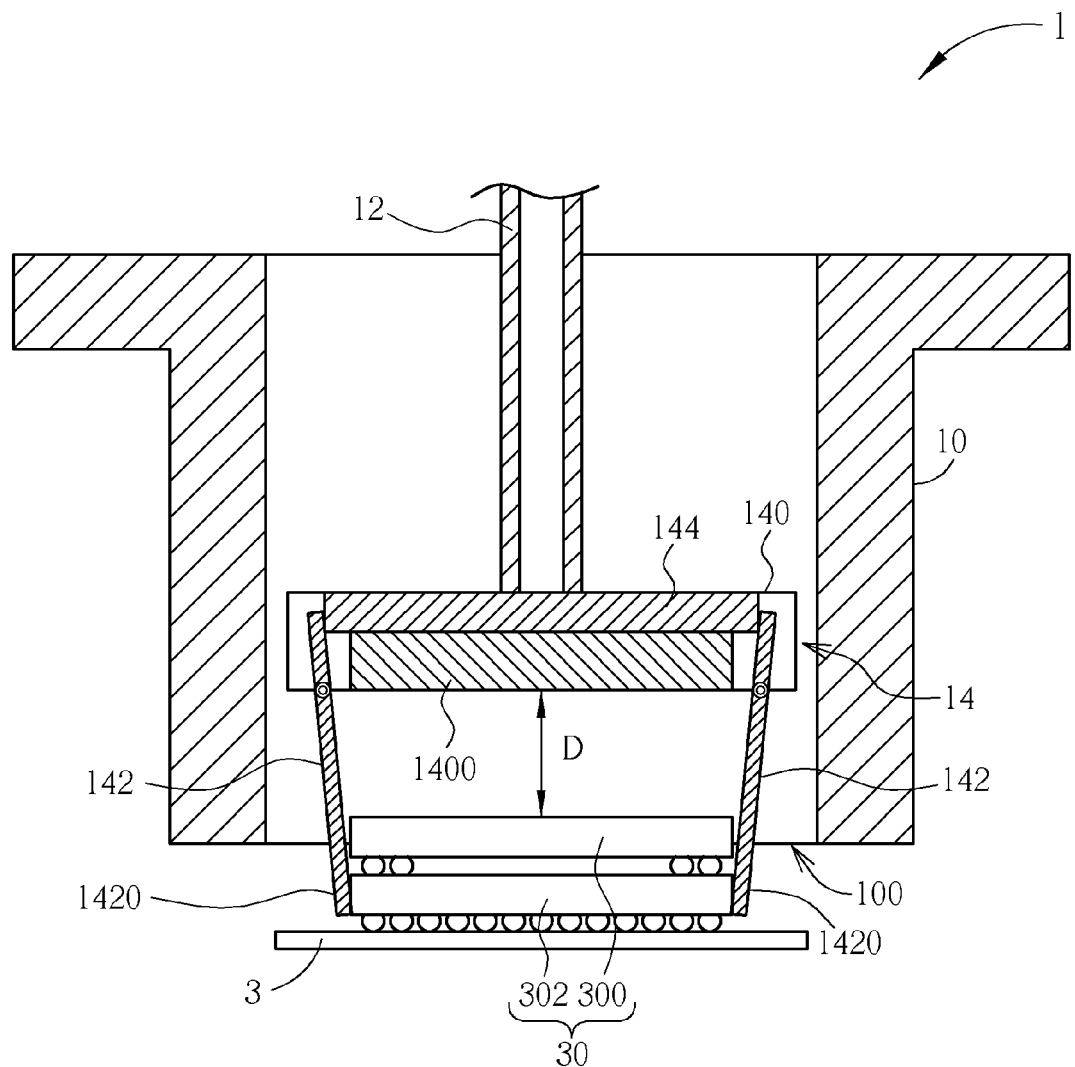
FIG. 3 is a schematic diagram illustrating the clamping tool shown in FIG. 1 being used to clamp the lower component.

Referring to FIG. 3, FIG. 3 is a schematic diagram illustrating the clamping tool 14 shown in FIG. 1 being used to clamp the lower component 302. As shown in FIG. 3, if the lower component 302 needs to be removed, the moving mechanism 12 can be operated to drive the clamping tool 14 to move with respect to the hot wind chamber 10 so as to move the two clamping ends 1420 of the two clamping members 142 to opposite sides of the lower component 302, respectively. When the hot wind is blown out of the hot wind chamber 10 to heat the component 30, the thermal expansion member 144 is also heated by the hot wind and then expands so as to push the two clamping members 142 to rotate with respect to each other. Consequently, the two clamping ends 1420 of the two clamping members 142 will clamp the lower component 302. After the solder balls between the lower component 302 and the circuit board 3 are melted, the moving mechanism 12 can be operated to drive the clamping tool 14 to move upwardly so as to remove the lower component 302.

Figure 4:
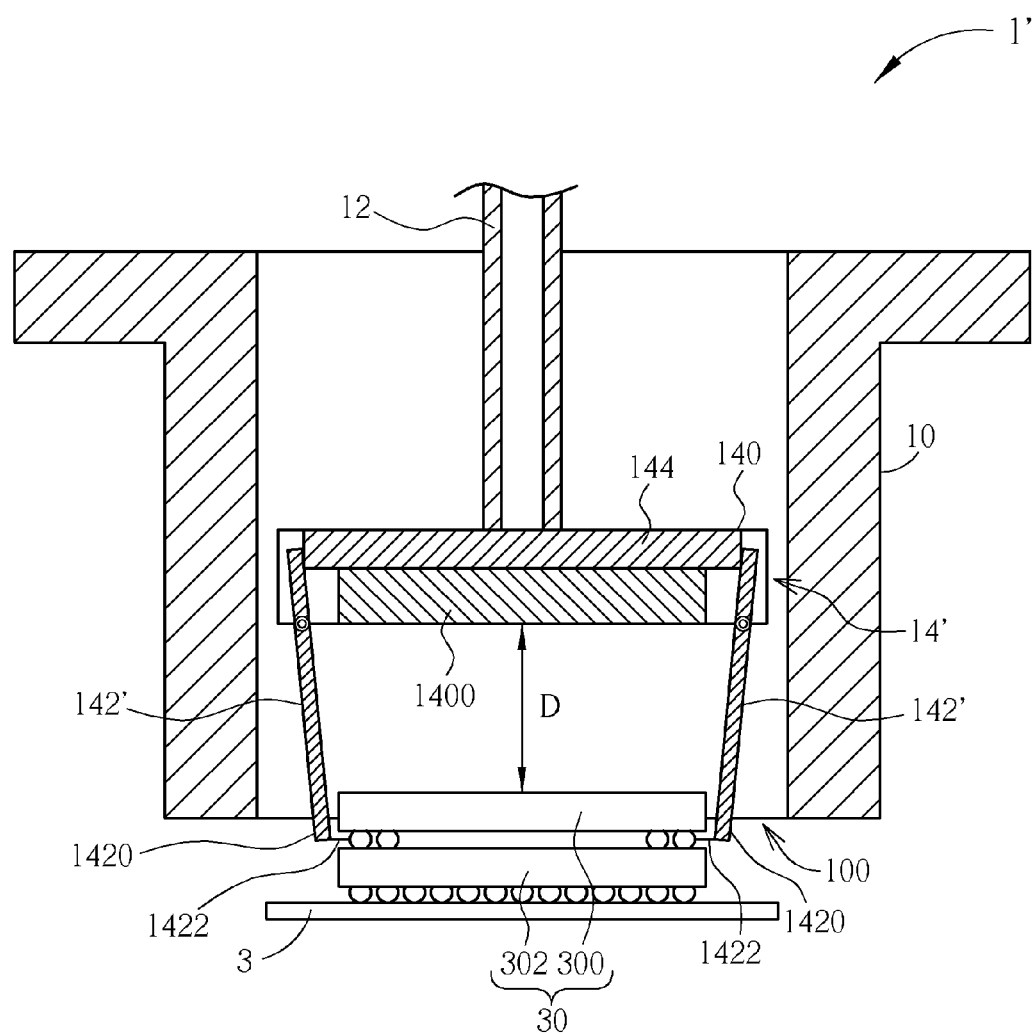
FIG. 4 is a schematic diagram illustrating a cross-section of an equipment for rework process and a circuit board according to another embodiment of the invention.

Referring to FIG. 4, FIG. 4 is a schematic diagram illustrating a cross-section of an equipment 1' for rework process and a circuit board 3 according to another embodiment of the invention. The main difference between the equipment 1' and the aforesaid equipment 1 is that each clamping member 142' of the clamping tool 14' of the equipment 1' has a hook-shaped clamping portion 1422. The hook-shaped clamping portion 1422 can increase stability while removing the upper component 300 or the lower component 302. It should be noted that the same elements in FIG. 4 and FIGS. 1-3 are represented by the same numerals, so the repeated explanation will not be depicted herein again.

Figure 5:
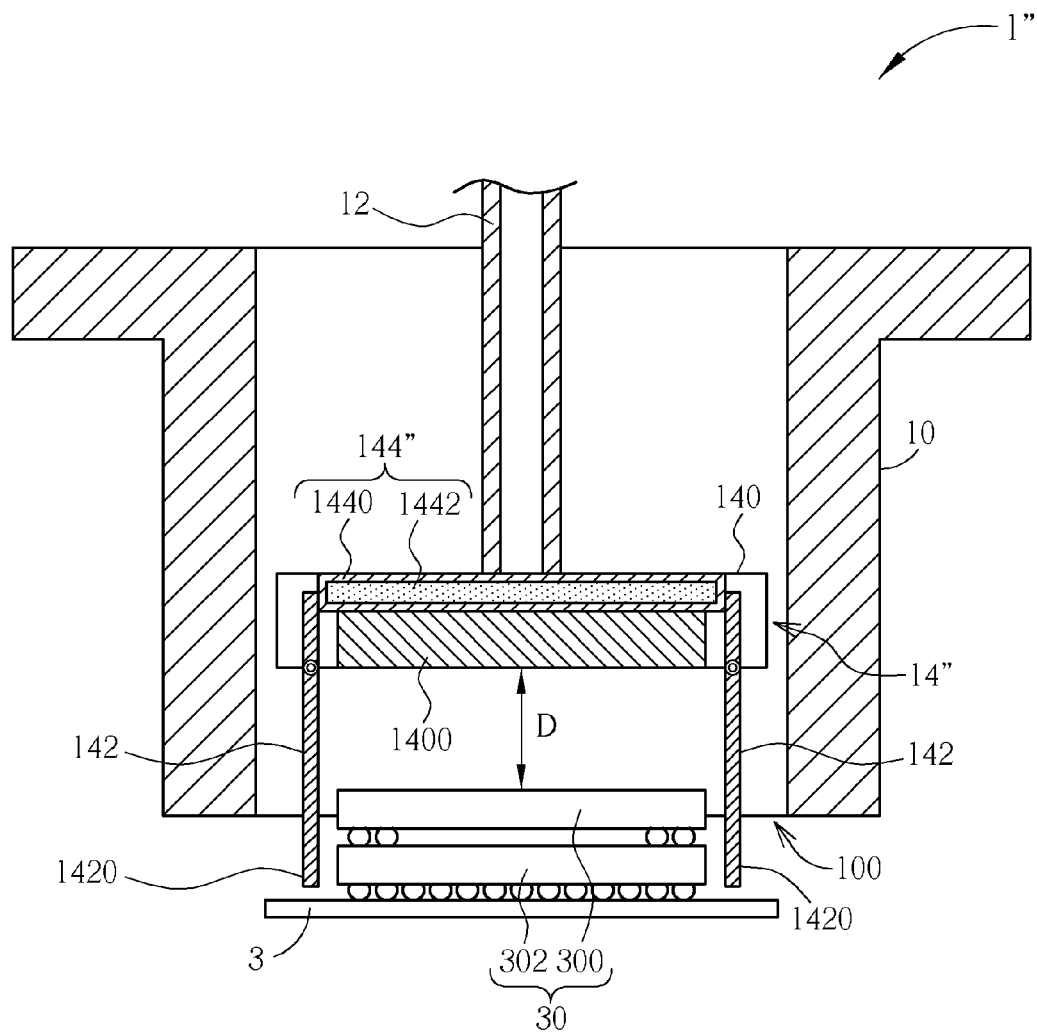
FIG. 5 is a schematic diagram illustrating a cross-section of an equipment for rework process and a circuit board according to another embodiment of the invention.
Figure 6:
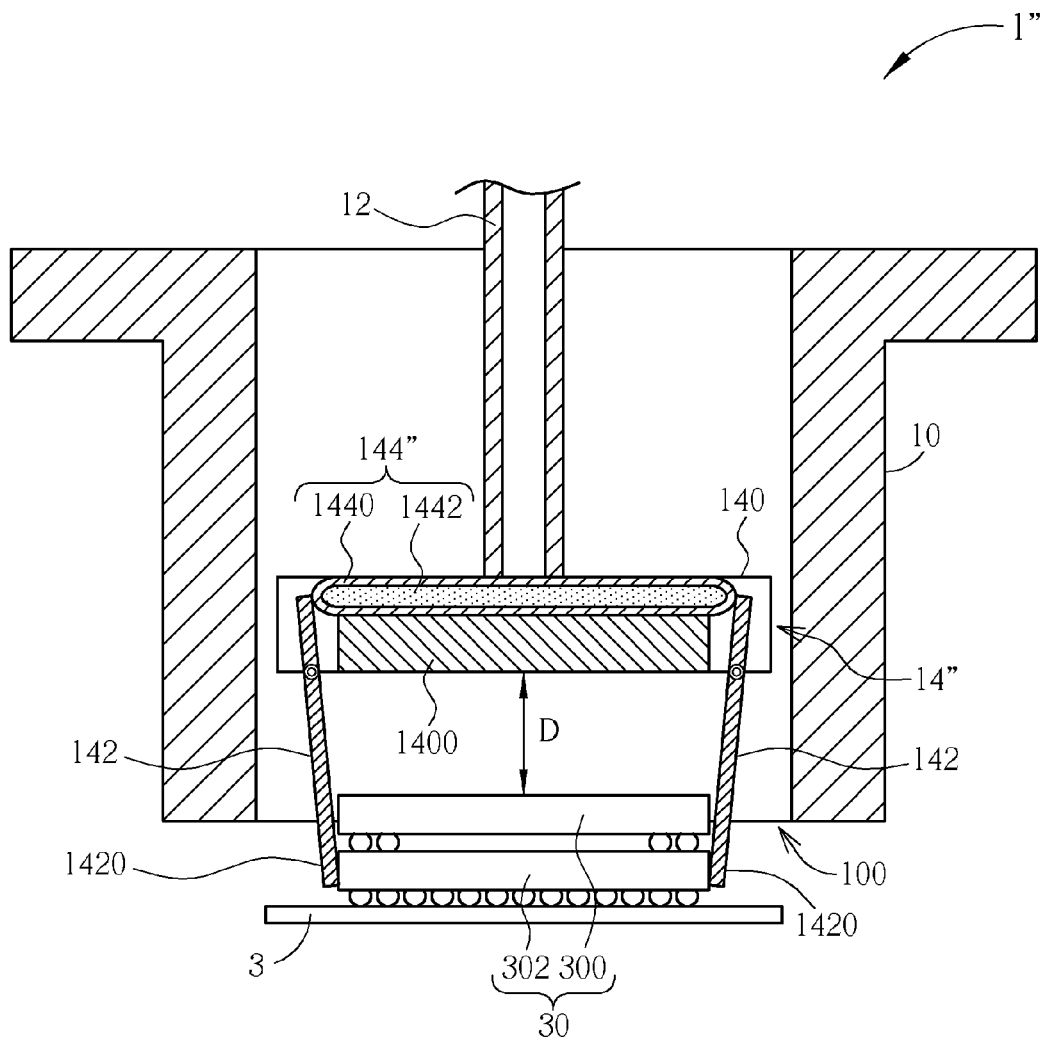
FIG. 6 is a schematic diagram illustrating the thermal expansion member shown in FIG. 5 expanding by heat.

Referring to FIGS. 5 and 6, FIG. 5 is a schematic diagram illustrating a cross-section of an equipment 1" for rework process and a circuit board 3 according to another embodiment of the invention, and FIG. 6 is a schematic diagram illustrating the thermal expansion member 144" shown in FIG. 5 expanding by heat. The main difference between the equipment 1" and the aforesaid equipment 1 is that the thermal expansion member 144" of the clamping tool 14" of the equipment 1" comprises a thermal expansion chamber 1440 and a thermal expansion substance 1442 filled in the thermal expansion chamber 1440. In this embodiment, the thermal expansion chamber 1440 may be made of plastic or rubber and the thermal expansion substance 1442 may be liquid or gas. For example, the thermal expansion chamber 1440 may be made of polyimide (PI) or the like with high thermal expansion coefficient. Furthermore, a heat tolerance of the thermal expansion chamber 1440 may exceed 350° C. The thermal expansion substance 1442 may be, but not limited to, water. When the hot wind is blown out of the hot wind chamber 10 to heat the component 30, the thermal expansion substance 1442 is also heated by the hot wind and then generates high pressure to expand the thermal expansion chamber 1440 so as to push the two clamping members 142 to rotate with respect to each other. It should be noted that the same elements in FIG. 5-6 and FIGS. 1-3 are represented by the same numerals, so the repeated explanation will not be depicted herein again.

Compared to the prior art, when the clamping tool of the invention is used in rework process, the moving mechanism can be operated to drive the clamping tool to move to a specific position above a component, which needs to be reworked. Afterward, when a hot wind is blown out of the hot wind chamber to heat the component, the thermal expansion member is also heated by the hot wind and then expands so as to push the two clamping members to rotate with respect to each other. Consequently, the two clamping members will clamp the component. After the solder balls are melted, the moving mechanism can be operated to drive the clamping tool to move so as to remove the component. Therefore, when the clamping tool of the invention is used to rework a multi-layer PoP component, the operator can select to remove which component by changing a distance between the clamping tool and the PoP component such that the clamping tool of the invention can be adapted to any PoP components and need not be customized.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clamping tool for rework process comprising:
   a casing having a base;
   two clamping members pivotally connected to the casing and located at opposite sides of the base; and
   a thermal expansion member disposed in the casing and located over the base, the thermal expansion member being capable of expanding by heat so as to push the two clamping members to rotate with respect to each other.

2. The clamping tool of claim 1, wherein each of the two clamping members has a hook-shaped clamping portion.

3. The clamping tool of claim 1, wherein a heat tolerance of the thermal expansion member exceeds 350° C.

4. The clamping tool of claim 3, wherein the thermal expansion member is made of plastic or rubber.

5. The clamping tool of claim 1, wherein the thermal expansion member comprises a thermal expansion chamber and a thermal expansion substance filled in the thermal expansion chamber.

6. The clamping tool of claim 5, wherein the thermal expansion chamber is made of plastic or rubber and the thermal expansion substance is liquid or gas.

7. An equipment for rework process comprising:
 a hot wind chamber;
 a moving mechanism movably disposed in the hot wind chamber; and
 a clamping tool disposed in the hot wind chamber, the clamping tool comprising:
  a casing having a base, the moving mechanism being connected to the casing and used for driving the casing to move with respect to the hot wind chamber;
  two clamping members pivotally connected to the casing and located at opposite sides of the base; and
  a thermal expansion member disposed in the casing and located over the base, the thermal expansion member being capable of expanding by heat so as to push the two clamping members to rotate with respect to each other.

8. The equipment of claim 7, wherein each of the two clamping members has a hook-shaped clamping portion.

9. The equipment of claim 7, wherein a heat tolerance of the thermal expansion member exceeds 350° C.

10. The equipment of claim 9, wherein the thermal expansion member is made of plastic or rubber.

11. The equipment of claim 7, wherein the thermal expansion member comprises a thermal expansion chamber and a thermal expansion substance filled in the thermal expansion chamber.

12. The equipment of claim 11, wherein the thermal expansion chamber is made of plastic or rubber and the thermal expansion substance is liquid or gas.

13. The equipment of claim 7, wherein the moving mechanism is a vacuum nozzle.

* * * * *